(12) United States Patent
Konishi et al.

(10) Patent No.: US 6,638,666 B2
(45) Date of Patent: Oct. 28, 2003

(54) SUBSTRATE FOR A TRANSFER MASK, TRANSFER MASK, AND METHOD OF MANUFACTURING THE TRANSFER MASK

(75) Inventors: Toshio Konishi, Tokyo (JP); Akira Tamura, Tokyo (JP); Kojiro Ito, Tokyo (JP); Yushin Sasaki, Tokyo (JP); Hideyuki Eguchi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 10/052,509

(22) Filed: Jan. 23, 2002

(65) Prior Publication Data

US 2002/0060297 A1 May 23, 2002

Related U.S. Application Data

(63) Continuation of application No. PCT/JP01/03638, filed on Apr. 26, 2001.

(30) Foreign Application Priority Data

May 25, 2000 (JP) .......................... 2000-154661
Dec. 8, 2000 (JP) .......................... 2000-374109

(51) Int. Cl.⁷ .............................. G03F 9/00; G03C 5/00
(52) U.S. Cl. ............................................ 430/5; 430/296
(58) Field of Search ........................... 430/5, 296, 322; 428/131, 137, 138, 428

(56) References Cited

U.S. PATENT DOCUMENTS 4,804,600 A    2/1989  Kato et al. ...................... 430/5
6,124,063 A *  9/2000  Dauksher et al. .............. 430/5
6,296,925 B1  10/2001  Itoh ............................. 428/138

FOREIGN PATENT DOCUMENTS

| EP | 368 089 | 5/1990 |
| EP | 866 372 | 9/1998 |
| GB | 2 088 084 | 6/1982 |
| GB | 2 351 567 | 1/2001 |
| JP | 5-216216 | 8/1993 |
| JP | 6-130655 | 5/1994 |
| JP | 9-186067 | 7/1997 |
| JP | 10-142774 | 5/1998 |
| JP | 2000-21729 | 1/2000 |
| JP | 2000-306832 | 11/2000 |
| JP | 2000-349023 | 12/2000 |
| WO | 89/03544 | 4/1989 |
| WO | WO 99/49365 | 9/1999 |

* cited by examiner

Primary Examiner—S. Rosasco

(57) ABSTRACT

A substrate for a transfer mask, which comprises a first silicon layer formed of monocrystalline silicon, a silicon oxide film formed on the first silicon layer and having a thickness ranging from 0.2 to 0.8 μm, and a second silicon layer formed on the silicon oxide film. A transfer mask which is manufactured by making use of this substrate is featured in that it is possible to prevent a transfer pattern from being cracked or destroyed due to stress from the silicon oxide film on the occasion of manufacturing the transfer mask, thereby providing a defect-free transfer mask.

13 Claims, 4 Drawing Sheets

SUBSTRATE FOR A TRANSFER MASK, TRANSFER MASK, AND METHOD OF MANUFACTURING THE TRANSFER MASK

CROSS-REFERENCE TO RELATED APPLICATIONS

This is a Continuation Application of PCT Application No. PCT/JP01/03638, filed Apr. 26, 2001, which was not published under PCT Article 21(2) in English.

This application is based upon and claims the benefit of priority from the prior Japanese Patent Applications No. 2000-154661, filed May 25, 2000; and No. 2000-374109, field Dec. 8, 2000, the entire contents of both of which are incorporated herein by reference.

BACKGROUND OF THE INVENTION

1. Field of the Invention

The present invention relates to a substrate for a transfer mask which is adapted for use in an exposure process using a charged beam such as electron beam or ion beam. The present invention relates also to a transfer mask and to the manufacturing method of the transfer mask.

2. Description of the Related Art

Recently, electron beam lithography, ion beam lithography, etc., where an electron beam or ion beam is employed as an exposure light source, have come to be seen as useful in a technique for manufacturing elements having an ultrafine pattern of the next generation. In the exposure process utilizing these manufacturing techniques, it is required to employ a transfer mask. In the manufacture of this transfer mask, a substrate formed of an SOI (Silicon On Insulator) substrate is employed because of the easiness in fine working.

This SOI substrate for forming a transfer pattern is constituted by a lower monocrystalline silicon wafer as a substrate, a silicon oxide film formed on the lower monocrystalline silicon wafer and functioning as an etching stopper, and an upper monocrystalline silicon wafer formed on the silicon oxide film, the transfer pattern being formed on the upper monocrystalline silicon wafer.

The thickness of silicon oxide film constituting part of the SOI substrate to be employed as a substrate for a transfer mask is generally within the range of about 1 $\mu$m to 2 $\mu$m. However, there is a problem in the employment of the SOI substrate comprising a silicon oxide film having such a magnitude of thickness that cracks tend to be formed in the upper monocrystalline silicon wafer due to stress imposed thereon by the silicon oxide film, thereby destroying the transfer pattern and hence deteriorating the manufacturing efficiency of the transfer mask.

Therefore, an object of the present invention is to provide a substrate for a transfer mask, which comprises a couple of silicon layers laminated with a silicon oxide film being interposed therebetween, and which makes it possible to stably manufacture a defect-free transfer mask, i.e. a transfer mask wherein a transfer pattern formed on the upper silicon layer is prevented from being destroyed due to stress from the silicon oxide film on the occasion of manufacturing a transfer mask by making use of the substrate.

Another object of the present invention is to provide a transfer mask which comprises a transfer pattern formed on the upper silicon layer of the aforementioned substrate for a transfer mask, and which makes it possible to prevent the transfer pattern formed on the upper silicon layer from being destroyed due to stress from the silicon oxide film on the occasion of manufacturing the transfer mask, thereby providing a defect-free transfer mask.

A further object of the present invention is to provide a method of manufacturing the aforementioned transfer mask, which makes it possible to prevent the transfer pattern formed on the upper silicon layer from being destroyed due to stress from the silicon oxide film, thereby enabling a defect-free transfer mask to be manufactured.

BRIEF SUMMARY OF THE INVENTION

According to the present invention, there is provided a substrate for a transfer mask, which comprises a first silicon layer formed of monocrystalline silicon; a silicon oxide film formed on the first silicon layer and having a thickness ranging from 0.2 to 0.8 $\mu$m; and a second silicon layer formed on the silicon oxide film.

According to the present invention, there is further provided a transfer mask comprising a first silicon layer formed of monocrystalline silicon; a silicon oxide film formed on the first silicon layer and having a thickness ranging from 0.2 to 0.8 $\mu$m; and a second silicon layer formed on the silicon oxide film and bearing therein a transfer pattern; wherein openings are formed in the first silicon layer, and the portions of the silicon oxide film which correspond to the openings are removed.

According to the present invention, there is further provided a method of manufacturing a transfer mask, the method comprising: preparing a substrate comprising a first silicon layer formed of monocrystalline silicon, a silicon oxide film formed on the first silicon layer and having a thickness ranging from 0.2 to 0.8 $\mu$m, and a second silicon layer formed on the silicon oxide film; forming a transfer pattern on the second silicon layer; forming openings in the first silicon layer before or after forming the transfer pattern; and selectively removing portions of the silicon oxide film which correspond to the openings.

According to the present invention, there is further provided a method of manufacturing a transfer mask, the method comprising: preparing a substrate comprising a first silicon layer formed of monocrystalline silicon, a silicon oxide film formed on the first silicon layer and having a thickness ranging from 0.2 to 0.8 $\mu$m, and a second silicon layer formed on the silicon oxide film; forming openings in the first silicon layer; selectively removing portions of the silicon oxide film which correspond to the openings; and forming a transfer pattern in the second silicon layer.

According to the present invention, there is further provided a method of irradiating a charged particle beam, the method comprising: irradiating a charged particle beam onto the aforementioned transfer mask in such a manner as to shape the charged particle beam in conformity with the configuration of a transfer pattern; and image-forming a pattern of the shaped charged particle beam on a substrate through a lens.

It is preferable in the present invention that the second silicon layer has a film thickness of 0.1 to 50 $\mu$m. Further, the second silicon layer should preferably be formed of monocrystalline silicon.

The substrate for a transfer mask according to the present invention should preferably be formed of an SOI substrate comprising two monocrystalline silicon wafers superposed on one another via a silicon oxide film being interposed therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Next, a substrate for a transfer mask as well as a transfer mask according to one embodiment of the present invention will be explained in detail with reference to the drawings.

Figure 1:
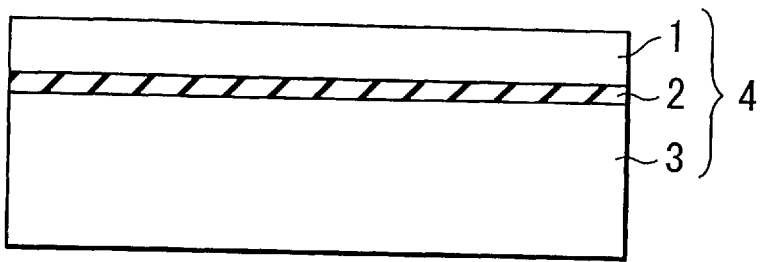
FIG. 1 is a cross-sectional view showing a substrate (SOI substrate) for a transfer mask according to one example of the present invention.

FIG. 1 is a cross-sectional view showing a substrate (SOI substrate) for a transfer mask according to one example of the present invention. Referring to FIG. 1, the substrate (SOI substrate) for a transfer mask 4 is constituted by a laminated structure comprising a lower monocrystalline silicon wafer 3 in which openings are to be subsequently formed, an upper monocrystalline silicon wafer 1 in which a transfer pattern is to be subsequently formed, and a silicon oxide film 2 interposed between the lower monocrystalline silicon wafer 3 and the upper monocrystalline silicon wafer 1. This laminated structure is featured in that the thickness of the silicon oxide film 2 is confined to a range of 0.2 $\mu$m to 0.8 $\mu$m.

If the thickness of the silicon oxide film 2 is less than 0.2 $\mu$m, the etching resistance of the silicon oxide film 2 may become insufficient, thereby easily inviting a phenomenon wherein the etching is permitted to proceed passing through the silicon oxide film 2, because over-etching is usually performed taking the in-plane distribution of etching depth or the distribution of etching depth depending on the size of pattern into consideration on the occasion of performing dry etching of the upper monocrystalline silicon wafer 1.

When the etching is permitted to proceed passing through the silicon oxide film 2, a wet etching liquid is permitted to penetrate through this etched through-hole formed in the silicon oxide film 2 on the occasion of wet etching to form an opening portion in the lower monocrystalline silicon wafer 3, thereby raising a problem that the transfer pattern formed on the upper monocrystalline silicon wafer 1 may be destroyed.

Further, when the etching is permitted to proceed passing through the silicon oxide film 2, an inert gas as a cooling medium is allowed to leak through this etched through-hole formed in the silicon oxide film 2 on the occasion of dry etching to form an opening portion in the lower monocrystalline silicon wafer 3 while directly cooling the substrate by making use of a cooling medium, thereby raising a problem that the discharging for etching is caused to be suspended in a midway of the etching process. This leakage of inert gas is also caused in the case where the etching of the lower monocrystalline silicon wafer 3 is performed prior to the formation of the transfer pattern.

On the other hand, if the thickness of the silicon oxide film 2 is larger than 0.8 $\mu$m, cracks may be generated in the transfer pattern, thereby destroying the transfer pattern due to the stress from the silicon oxide film 2 on the occasion where the silicon oxide film 2 is permitted to be expose due to wet etching or dry etching of the lower monocrystalline silicon wafer 3 to form an opening therein.

Namely, when the thickness of the silicon oxide film 2 is confined within the range of 0.2 $\mu$m to 0.8 $\mu$m, the phenomenon of generating cracks in the transfer pattern to destroy the transfer pattern can be prevented.

Incidentally, a monocrystalline or polycrystalline silicon layer deposited on the surface of the silicon oxide film 2 may be substituted for the upper monocrystalline silicon wafer 1.

Further, in the present invention, the thickness of the upper monocrystalline silicon wafer or the upper silicon layer should preferably be within the range of 0.1 $\mu$m to 50 $\mu$m, more preferably, within the range of 1 $\mu$m to 50 $\mu$m.

If the transfer mask of the present invention is to be applied to a scattering type transfer mask, the thickness of the upper monocrystalline silicon wafer or the upper silicon layer should preferably be within the range of 0.1 to 3 $\mu$m. Whereas, if the transfer mask of the present invention is to be applied to a shielding type transfer mask, the thickness of the upper monocrystalline silicon wafer or the upper silicon layer should preferably be within the range of 5 to 50 $\mu$m.

In either case, if the thickness of the upper monocrystalline silicon wafer or the upper silicon layer is too thin, the upper monocrystalline silicon wafer or the upper silicon layer may be fused away as the magnitude of electric current is increased in order to enhance throughput. On the other hand, if the thickness of the upper monocrystalline silicon wafer or the upper silicon layer is too thick, it may become difficult to form a transfer pattern.

Further, the thickness of the lower monocrystalline silicon wafer according to the present invention should preferably be within the range of about 400 $\mu$m to 1 mm. Because, if the thickness of the lower monocrystalline silicon wafer is less than 400 $\mu$m, it may be no longer possible to ensure its function as a supporting body for the transfer mask. On the other hand, if the thickness of the lower monocrystalline silicon wafer exceeds 1 mm, it may become difficult to satisfactorily work the substrate, i.e., the lower monocrystalline silicon wafer.

Figure 2:
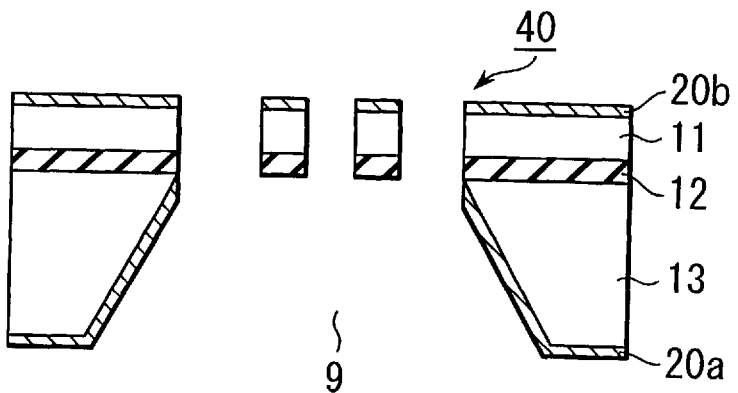
FIG. 2 is a cross-sectional view showing one example of a transfer mask which was manufactured by making use of a substrate (SOI substrate) for a transfer mask according to one example of the present invention.

FIG. 2 is a cross-sectional view showing one example of a transfer mask which was manufactured by making use of the aforementioned substrate (SOI substrate) 4 for a transfer mask, representing another embodiment of the present invention. As shown in FIG. 2, the transfer mask 40 according to another embodiment of the present invention is constituted by a lower monocrystalline silicon wafer 13 having an opening 9, a silicon oxide film 12 having an opening, and an upper monocrystalline silicon wafer 11 bearing therein a transfer pattern 6.

The construction shown in FIG. 2 represents one embodiment where a conductive film 20a is formed on the lower monocrystalline silicon wafer 13 having an opening 9, and at the same time, a conductive film 20b is formed on the upper monocrystalline silicon wafer 11 bearing therein a transfer pattern. However, these conductive films 20a, 20b are not necessarily essential, and may be omitted.

Next, the manufacturing process of the transfer mask according to another embodiment of the present invention will be explained as follows.

First of all, a fine pattern is formed on the surface of the upper monocrystalline silicon wafer 11. This process of forming this fine pattern is performed by a sequence of steps comprising, stepwise, a step of forming a resist pattern on the surface of the upper monocrystalline silicon wafer 11, a step of dry-etching the upper monocrystalline silicon wafer 11 by making use of this resist pattern as a mask, and a step of removing the resist pattern.

The exposure process of forming the resist pattern can be suitably performed by directly scanning an electron beam using a resist for an electron beam, or by means of stepper exposure using a photoresist.

In the case where the etching resistance of the resist is found insufficient on the occasion of dry-etching the upper monocrystalline silicon wafer, it is possible to employ, as an etching mask, an inorganic film such as a silicon oxide film, a silicon nitride film, a silicon carbide film, etc.; a metallic film made of chromium, tungsten, tantalum, titanium, nickel, aluminum, etc., or an alloy of these metals; or a metallic compound film formed through a reaction between any of these metals or alloys and oxygen, nitrogen, carbon, etc. These etching masks can be formed by means of various kinds of thin film-forming method. For example, it is possible to employ a sputtering method, a CVD method, a vapor deposition method, etc.

As for the dry etching method, there is not any particular limitation with respect to the conditions for the etching. As for the gas to be employed in the dry etching, it is possible to employ a mixed gas mainly comprising a fluorine-containing gas such as $SF_6$ gas and $CF_4$ gas.; a mixed gas mainly comprising a chlorine-containing gas such as $Cl_2$ gas and $SiCl_4$ gas; or a mixed gas mainly comprising a bromine-containing gas such as HBr gas. As for the dry etching apparatus, it is possible to employ that where RIE, magnetron RIE, ECR, ICP, microwaves, helicon waves, NLD, etc., is employed as a discharge system.

Next, openings are formed in the lower monocrystalline silicon wafer, wherein dry etching, wet etching, ultrasonic working, sand blasting, etc., can be suitably employed.

Incidentally, the step of forming a transfer pattern in the upper monocrystalline silicon wafer may be performed prior to or subsequent to the step of forming openings in the lower monocrystalline silicon wafer.

Next, the silicon oxide film formed on the openings is removed. Specifically, the silicon oxide film can be removed by making use of hydrofluoric acid, which is followed by the formation of conductive film on opposite main surfaces if required, thereby accomplishing a transfer mask.

As for the conductive film, it is possible to employ a metal such as gold, platinum, palladium, tantalum, tungsten, molybdenum and osmium; or an alloy containing any of these metals. These metals can be employed singly or together with an underlying layer. As for the method of forming the conductive film, it is possible to employ a sputtering method, a CVD method, a vapor deposition method, a plating method, an electrode position method, an ion plating method, etc.

As described above, the formation of openings in the lower monocrystalline silicon wafer can be performed prior to the formation of a transfer pattern in the upper monocrystalline silicon wafer. In this case, part of the silicon oxide film which is exposed through the openings formed in the lower monocrystalline silicon wafer may be selectively removed prior to the formation of a transfer pattern in the upper monocrystalline silicon wafer. On the occasion of forming a transfer pattern in this process, there is little possibility that the transfer pattern is cracked or destroyed due to stress generated in the silicon oxide film, since the silicon oxide film does not exist at this portion.

However, in order to prevent leakage of the inert gas to be employed for cooling the substrate on the occasion of the dry etching step for forming a transfer pattern on the upper monocrystalline silicon wafer, it may be necessary to take some sort of measures such as the placement of the lower monocrystalline silicon wafer on a holder which is excellent in thermal conductivity.

EXAMPLES

Next, specific example of the present invention will be explained with reference to drawings.

Example 1

Figure 3A:
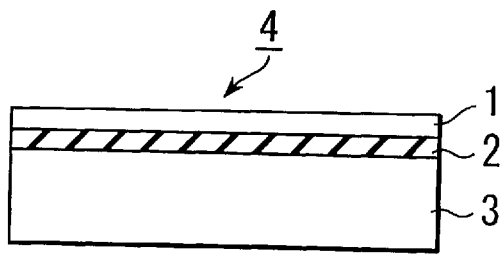
FIGS. 3A to 3I are cross-sectional views illustrating stepwise one example of a manufacturing process of a transfer mask by making use of a substrate for a transfer mask according to the present invention.

FIGS. 3A to 3I are cross-sectional views illustrating stepwise one example of a manufacturing process of a transfer mask by making use of a substrate for a transfer mask according to one embodiment of the present invention. First of all, as shown in FIG. 3A, an SOI substrate exhibiting a plane orientation of (100) was employed as a substrate 4 for a transfer mask (which is referred to also as a transfer mask substrate). This transfer mask substrate 4 was constituted by a laminated structure comprising an upper monocrystalline silicon wafer 1, a lower monocrystalline silicon wafer 3, and a silicon oxide film 2 interposed between these upper monocrystalline silicon wafer 1 and lower monocrystalline silicon wafer 3. The thickness of the upper monocrystalline silicon wafer 1 was 20 $\mu$m, the thickness of the silicon oxide film was 0.5 $\mu$m, and the thickness of the lower monocrystalline silicon wafer 3 was 500 $\mu$m.

Figure 3B:
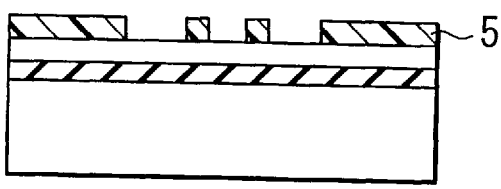

Then, a resist for an electron beam (ZEP520, Nihon Zeon Co., Ltd.) was coated to a thickness of 0.5 $\mu$m on the surface of the upper monocrystalline silicon wafer 1 of the transfer mask substrate 4, and a pattern was described on the resist by making use of an electron beam drawing machine exhibiting an accelerating voltage of 50 kV. Subsequently, by making use of a developing solution for exclusive use (ZED-N50, Nihon Zeon Co., Ltd.), the development of the resist was performed, thereby forming a resist pattern 5 as shown in FIG. 3B.

Figure 3C:
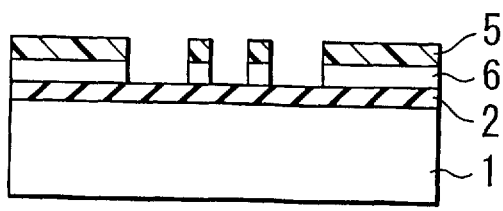

Next, by making use of the resist pattern 5 as a mask together with the employment of a mixed gas mainly consisting of fluorine-containing gas, i.e., $SF_6$, as an etchant, the dry etching of the upper monocrystalline silicon wafer 1 was performed to a depth extending to the silicon oxide film 2 by means of an ICP (inductively coupled plasma) dry etching apparatus, thereby forming a transfer pattern 6 as shown in FIG. 3C.

Figure 3D:
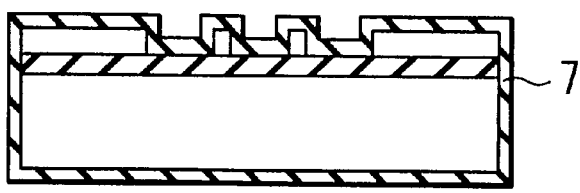

Then, the resist pattern 5 was removed, and a silicon nitride film 7 having a thickness of 0.3 $\mu$m was formed on the opposite main surfaces and peripheral wall of the transfer mask substrate as shown in FIG. 3D by means of an LPCVD (Low Pressure Chemical Vapor Deposition) apparatus.

Figure 3E:
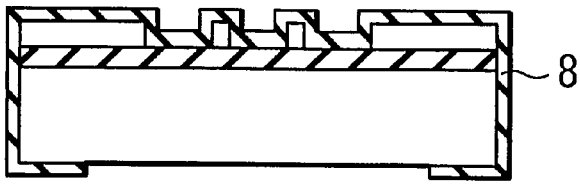

Subsequently, the silicon nitride film formed on the surface of the lower monocrystalline silicon wafer was subjected to dry etching by making use of a mixed gas mainly containing $CHF_3$ gas and by means of an RIE (Reactive Ion Etching) apparatus, thereby forming a protective pattern 8 for wet etching as shown in FIG. 3E.

Figure 3F:
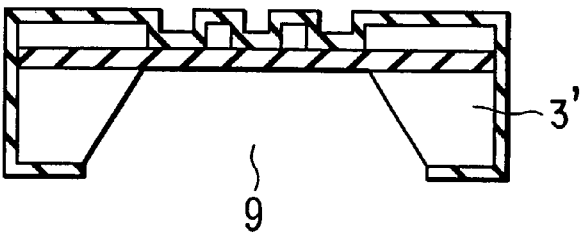

Then, the substrate bearing thereon the protective pattern 8 was set on a jig so as to protect the transfer pattern formed on the upper monocrystalline silicon wafer, and was immersed in an etching solution consisting of an aqueous solution of KOH which was heated to a temperature of about 90° C. Thus, the etching was performed using the protective pattern 8 as a mask to such an extent that the anisotropic etching of the lower monocrystalline silicon wafer 3 along the plane orientation thereof proceeded down to the silicon oxide film 2 functioning as an etching stopper, thereby forming an opening 9 as shown in FIG. 3F. The reference number 3' in FIG. 3F represents the lower monocrystalline silicon wafer in which the opening 9 was formed.

Figure 3G:
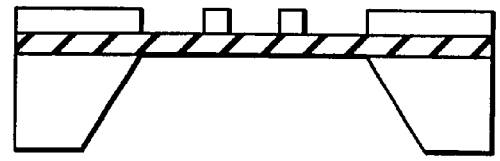
Figure 3H:
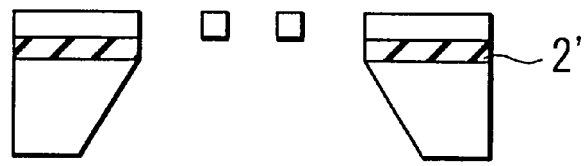

Next, as shown in FIG. 3G, the protective pattern 8 was etched away by making use of hot phosphoric acid heated to about 170° C. Thereafter, as shown in FIG. 3H, the exposed portion of the silicon oxide film 2 was etched away by making use of hydrofluoric acid. The reference number 2' in FIG. 3G represents the silicon oxide film in which openings were formed.

Figure 3I:
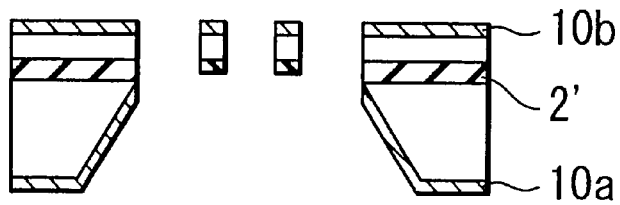

Finally, a platinum-palladium alloy having a thickness of about 0.1 $\mu$m was deposited on the opposite main surfaces of the resultant body by means of a magnetron sputtering apparatus to thereby form conductive films 10a and 10b, thus accomplishing a transfer mask as shown in FIG. 3I.

The transfer mask manufactured in this manner was free from cracks of the upper monocrystalline silicon wafer that might be caused by stress from the silicon oxide film, thereby obtaining a transfer mask which was excellent in quality.

Example 2

Figure 4A:
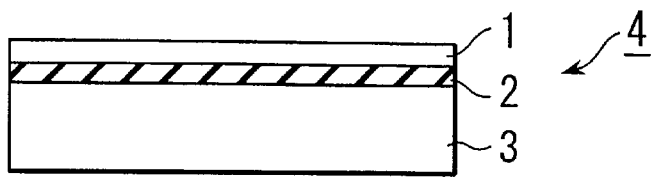
FIGS. 4A to 4I are cross-sectional views illustrating stepwise another example of a manufacturing process of a transfer mask by making use of a substrate for a transfer mask according to the present invention.

FIGS. 4A to 4I are cross-sectional views illustrating stepwise another example of a manufacturing process of a transfer mask by making use of a transfer mask substrate according to another embodiment of the present invention. First of all, as shown in FIG. 4A, an SOI substrate exhibiting a plane orientation of (100) was employed as a substrate 4 for a transfer mask (which is referred to also as a transfer mask substrate). This transfer mask substrate 4 was constituted by a laminate structure having the same constituent components as described in Example 1.

The thickness of the upper monocrystalline silicon wafer 1 was 20 $\mu$m, the thickness of the silicon oxide film was 0.5 $\mu$m, and the thickness of the lower monocrystalline silicon wafer 3 was 500 $\mu$m.

Figure 4B:
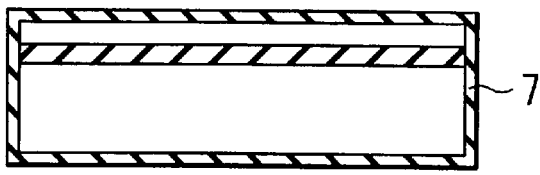
Figure 4C:
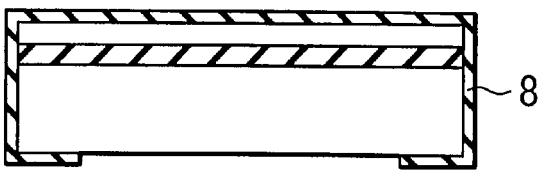

As shown in FIG. 4B, a silicon nitride film 7 was formed all over the transfer mask substrate 4 including the opposite main surfaces and peripheral wall thereof by means of the CVD method, and then, the silicon nitride film formed on the surface of the lower monocrystalline silicon wafer 3 was subjected to a patterning treatment, thereby forming a protective pattern 8 for wet etching as shown in FIG. 4C.

Then, the lower monocrystalline silicon wafer 3 having thereon the protective pattern 8 was set on a jig and immersed in an etching solution consisting of an aqueous solution of KOH which was heated to a temperature of about 90° C. Thus, the etching was performed using the protective pattern 8 as a mask to such an extent that the anisotropic etching of the lower monocrystalline silicon wafer 3 along the plane orientation thereof proceeded down to the silicon oxide film 2 functioning as an etching stopper, thereby forming an opening 9 as shown in FIG. 4D.

Figure 4D:
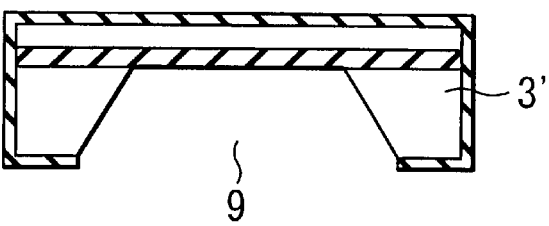

The reference number 3' in FIG. 4D represents the lower monocrystalline silicon wafer in which the opening 9 was formed.

Figure 4E:
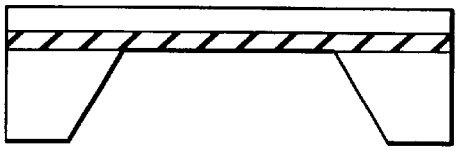
Figure 4F:
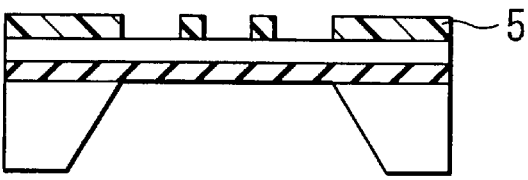

Next, as shown in FIG. 4E, the protective pattern 8 was etched away by making use of hot phosphoric acid heated to about 170° C. Thereafter, a resist for an electron beam was coated to a thickness of 0.5 $\mu$m on the surface of the upper monocrystalline silicon wafer 1, and a pattern was described on the resist by making use of an electron beam drawing machine exhibiting an accelerating voltage of 50 kV. Subsequently, by making use of a developing solution for exclusive use, the development of the resist was performed, thereby forming a resist pattern 5 as shown in FIG. 4F. The resist for an electron beam and the developing solution both employed herein were the same as those employed in Example 1.

Figure 4G:
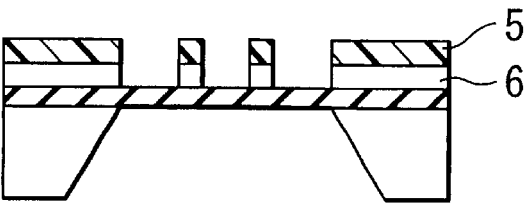

Next, by making use of the resist pattern 5 as a mask together with the employment of a mixed gas mainly consisting of fluorine-containing gas, i.e., $SF_6$, as an etchant, the dry etching of the upper monocrystalline silicon wafer 1 was performed to a depth extending to the silicon oxide film 2 by means of an ICP (inductively coupled plasma) dry etching apparatus, thereby forming a transfer pattern 6 as shown in FIG. 4G.

Figure 4H:
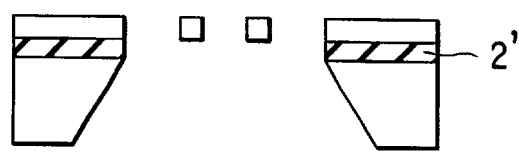

Then, the resist pattern 5 was removed as shown in FIG. 4H, and at the same time, the exposed portion of the silicon oxide film 2 was etched away by making use of buffer hydrofluoric acid. The reference number 2' in FIG. 4H represents the silicon oxide film in which openings were formed.

Figure 4I:
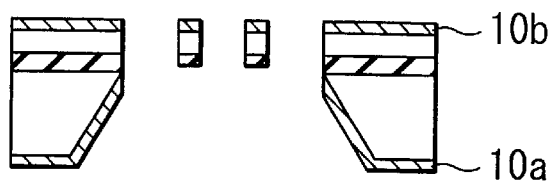

Finally, as shown in FIG. 4I, tantalum having a thickness of about 0.1 $\mu$m was deposited on the opposite main surfaces of the resultant body by means of an electron beam vapor deposition apparatus to thereby form conductive films 10a and 10b, thus accomplishing a transfer mask.

The transfer mask manufactured in this manner was free from cracks of the upper monocrystalline silicon wafer that might be caused by stress from the silicon oxide film, thereby obtaining a transfer mask which was excellent in quality.

Example 3

Figure 5A:
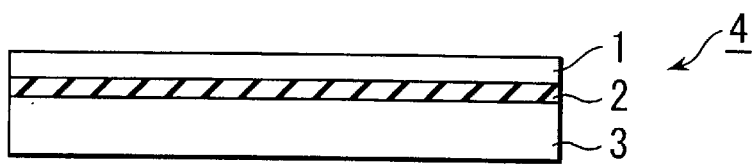
FIGS. 5A to 5F are cross-sectional views illustrating stepwise another example of a manufacturing process of a transfer mask by making use of a substrate for a transfer mask according to the present invention.

FIGS. 5A to 5F are cross-sectional views illustrating stepwise a further example of a manufacturing process of a transfer mask by making use of a transfer mask substrate according to a further embodiment of the present invention. First of all, as shown in FIG. 5A, an SOI substrate exhibiting a plane orientation of (100) was employed as a substrate for a transfer mask 4. This transfer mask substrate 4 was constituted by a laminate structure having the same constituent components as described in Example 1. The thickness of the upper monocrystalline silicon wafer 1 was 2 $\mu$m, the thickness of the silicon oxide film was 0.7 $\mu$m, and the thickness of the lower monocrystalline silicon wafer 3 was 500 $\mu$m.

Figure 5B:
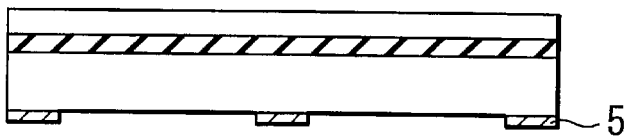
Figure 5C:
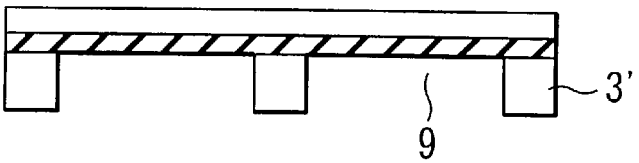

Then, as shown in FIG. 5B, a resist pattern 5 was formed on the surface of a lower monocrystalline silicon wafer 3 by means of ordinary photolithography. Subsequently, by making use of this resist pattern 5 as a mask together with the employment of a mixed gas mainly consisting of $SF_6$ as an etchant, etching of the lower monocrystalline silicon wafer 3 was performed by means of an ICP (inductively coupled plasma) dry etching apparatus to thereby form openings 9 as shown in FIG. 5C.

When all of the portion of the lower monocrystalline silicon wafer 3 for forming the openings 9 was completely removed by way of etching, the silicon oxide film 2 having a thickness of 0.7 μm was sufficiently capable of acting as an etching stopper. Further, the cross-section of the lower monocrystalline silicon wafer 3' which was provided with openings as a result of the aforementioned etching was found as having substantially perpendicular sidewalls.

Figure 5D:
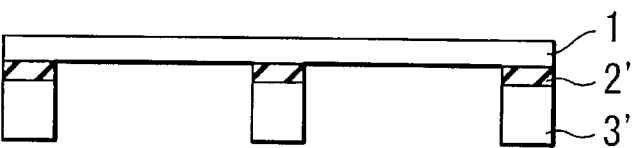

Then, as shown in FIG. 5D, the resist pattern 5 was removed by an ashing treatment using oxygen plasma, and the portion of the silicon oxide film 2 which was exposed through the openings 9 was completely etched away by making use of buffer hydrofluoric acid. The reference number 2' in FIG. 5D represents the silicon oxide film in which openings were formed.

Figure 5E:
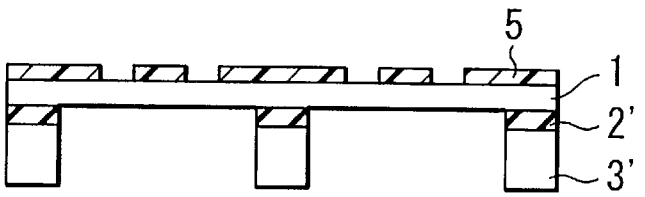

Thereafter, a resist for an electron beam was coated to a thickness of 1.0 μm on the surface of the upper monocrystalline silicon wafer 1, and a pattern was described on the resist by making use of an electron beam drawing machine exhibiting an accelerating voltage of 100 kV. Subsequently, by making use of a developing solution for exclusive use, the development of the resist was performed, thereby forming a resist pattern 5 as shown in FIG. 5E.

Figure 5F:
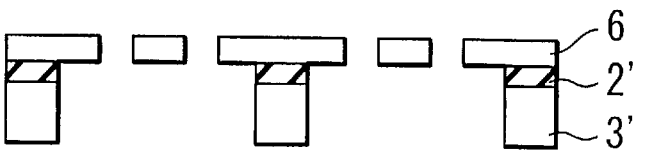

Next, by making use of the resist pattern 5 as a mask together with the employment of a mixed gas mainly consisting of HBr as an etchant, the dry etching of the upper monocrystalline silicon wafer 1 was performed by means of an ICP (inductively coupled plasma) dry etching apparatus, thereby forming a transfer pattern 6 enabling the charged particle beam to pass therethrough. Subsequently, the resist pattern 5 was removed by making use of an organic solvent. As a result, as shown in FIG. 5F, a transfer mask having the transfer pattern 6 was accomplished.

The transfer mask manufactured in this manner was mounted on a charged particle beam exposure apparatus, and this specimen was subjected to an exposure process using an electron beam as a charged particle beam.

Namely, the electron beam emitted from an electron gun was irradiated onto the transfer mask mounted on the stage arranged at a predetermined position in such a manner as to shape the charged particle beam in conformity with the configuration of the transfer pattern, the resultant shaped pattern of the charged particle beam being subsequently reduced by means of an electron lens and image-formed on the surface of the specimen having the resist film. As a result, it was found possible to perform an exposure of high precision which was exactly the same as designed.

Comparative Example 1

A transfer mask was manufactured under the same conditions as those of Example 1 except that the thickness of the silicon oxide film was set to 0.1 μm. When the upper monocrystalline silicon wafer of the transfer mask thus manufactured was investigated through observation thereof, destruction of the transfer pattern due to the wet etching solution was recognized.

Comparative Example 2

A transfer mask was manufactured under the same conditions as those of Example 1 except that the thickness of the silicon oxide film was set to 1 μm. When the upper monocrystalline silicon wafer of the transfer mask thus manufactured was investigated through observation thereof, cracking of the upper monocrystalline silicon wafer due to stress by the silicon oxide film was recognized, and hence the yield of the transfer mask which was free from cracking was found to be 0%.

As explained above, according to the present invention, since the transfer mask substrate which is constituted by a laminated structure comprising two silicon layers, and a silicon oxide film interposed between this pair of silicon layers is constructed such that the thickness of silicon oxide film was confined within the range of 0.2 μm to 0.8 μm, it is possible to attain the effect that the transfer pattern formed on the upper monocrystalline silicon wafer is caused to fracture due to stress by the silicon oxide film.

Furthermore, the transfer mask manufactured by making use of the aforementioned transfer mask substrate is of such a high quality that the upper monocrystalline silicon wafer can hardly be destroyed.

Moreover, according to the manufacturing method of the transfer mask by making use of the aforementioned transfer mask substrate, it is possible to stably manufacture a defect-free transfer mask.

Additionally, according to the method of irradiating a charged particle beam where the aforementioned transfer mask is employed, it is now possible to perform, at high precision, the patterning exposure of the resist formed on a substrate. As a result, patterning such as the patterning of a semiconductor can be performed with high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate for a transfer mask, which comprises a first silicon layer formed of monocrystalline silicon; a silicon oxide film formed on the first silicon layer and having a thickness ranging from 0.2 to 0.8 μm; and a second silicon layer formed on the silicon oxide film.

2. The substrate for a transfer mask according to claim 1, wherein said second silicon layer has a thickness ranging from 0.1 to 50 μm.

3. The substrate for a transfer mask according to claim 1, wherein said second silicon layer is formed of monocrystalline silicon.

4. A transfer mask comprising a first silicon layer formed of monocrystalline silicon; a silicon oxide film formed on the first silicon layer and having a thickness ranging from 0.2 to 0.8 μm; and a second silicon layer formed on the silicon oxide film and bearing therein a transfer pattern;
wherein openings are formed in said first silicon layer, and the portions of said silicon oxide film which correspond to said openings are removed.

5. The transfer mask according to claim 4, wherein said second silicon layer has a thickness ranging from 0.1 to 50 μm.

6. The transfer mask according to claim 4, wherein said second silicon layer is formed of monocrystalline silicon.

7. A method of manufacturing a transfer mask, the method comprising:
preparing a substrate comprising a first silicon layer formed of monocrystalline silicon, a silicon oxide film formed on the first silicon layer and having a thickness ranging from 0.2 to 0.8 µm, and a second silicon layer formed on the silicon oxide film;

forming a transfer pattern on said second silicon layer;

forming openings in said first silicon layer before or after forming said transfer pattern; and selectively removing portions of said silicon oxide film which correspond to said openings.

8. The method according to claim 7, wherein said second silicon layer has a thickness ranging from 0.1 to 50 µm.

9. The method according to claim 7, wherein said second silicon layer is formed of monocrystalline silicon.

10. A method of manufacturing a transfer mask, the method comprising:

preparing a substrate comprising a first silicon layer formed of monocrystalline silicon, a silicon oxide film formed on the first silicon layer and having a thickness ranging from 0.2 to 0.8 µm, and a second silicon layer formed on the silicon oxide film;

forming openings in said first silicon layer;

selectively removing portions of said silicon oxide film which correspond to said openings; and forming a transfer pattern in said second silicon layer.

11. The method according to claim 10, wherein said second silicon layer has a thickness ranging from 0.1 to 50 µm.

12. The method according to claim 10, wherein said second silicon layer is formed of monocrystalline silicon.

13. A method of irradiating a charged particle beam, the method comprising:

irradiating a charged particle beam onto the transfer mask as claimed in claim 4 in such a manner as to shape said charged particle beam in conformity with the configuration of a transfer pattern; and image-forming a pattern of said shaped charged particle beam on a substrate through a lens.

* * * * *